United States Patent
Chang et al.

(10) Patent No.: US 7,084,794 B2
(45) Date of Patent: Aug. 1, 2006

(54) DAC DC OFFSET CALIBRATION METHOD AND RELATED APPARATUS

(75) Inventors: Chia-Yi Chang, I-Lan Hsien (TW); Yeou-Jyh Tsai, Hsin-Chu (TW)

(73) Assignee: Mediatek Incorporation, Hsin-Chu Hsien (TW)

( * ) Notice: Subject to any disclaimer, the term of this patent is extended or adjusted under 35 U.S.C. 154(b) by 0 days.

(21) Appl. No.: 10/906,543

(22) Filed: Feb. 24, 2005

(65) Prior Publication Data

US 2005/0219092 A1 Oct. 6, 2005

Related U.S. Application Data

(60) Provisional application No. 60/521,238, filed on Mar. 18, 2004.

(30) Foreign Application Priority Data

Oct. 6, 2004 (TW) .............................. 93130224 A

(51) Int. Cl.
*H03M 1/10* (2006.01)
(52) U.S. Cl. ..................... 341/120; 341/144
(58) Field of Classification Search ................ 341/120, 341/143, 144, 155
See application file for complete search history.

(56) References Cited

U.S. PATENT DOCUMENTS

| | | | | |
|---|---|---|---|---|
| 5,278,558 | A | * | 1/1994 | Roth ........................ 341/120 |
| 6,154,158 | A | | 11/2000 | Walker |
| 6,351,228 | B1 | | 2/2002 | Kutsuno et al. |
| 6,501,405 | B1 | * | 12/2002 | Zhang et al. ............... 341/143 |
| 6,667,703 | B1 | | 12/2003 | Reuveni et al. |
| 6,707,404 | B1 | * | 3/2004 | Yilmaz ..................... 341/120 |
| 2001/0028320 | A1 | * | 10/2001 | Prendergast et al. |
| 2005/0219087 | A1 | * | 10/2005 | Chang et al. |

FOREIGN PATENT DOCUMENTS

| | | |
|---|---|---|
| DE | 31 42 152 C2 | 5/1983 |
| DE | 240 106 A1 | 10/1986 |

* cited by examiner

*Primary Examiner*—Jean Bruner Jeanglaude
(74) *Attorney, Agent, or Firm*—Winston Hsu

(57) ABSTRACT

The present invention discloses a DAC DC offset calibration method and related apparatus. The disclosed method includes the following steps. First, apply a first value and a second value to the DAC to generate a first measurement value and a second measurement value respectively. Then, without using any predetermined parameter, determine a DC compensation value according to the first value, the second value, the first measurement value, and the second measurement value. The DC compensation value is used to calibrate the DAC.

16 Claims, 3 Drawing Sheets

DAC DC OFFSET CALIBRATION METHOD AND RELATED APPARATUS

CROSS REFERENCE TO RELATED APPLICATIONS

This application claims the benefit of U.S. Provisional Application No. 60/521,238, which was filed on Mar. 18, 2004 and entitled "TX ADC DC Offset and Gain Mismatch Calibration Using Two-point Interpolation".

BACKGROUND

The present invention relates to a digital to analog converter (DAC), and more particularly, to a DAC DC offset calibration method and related apparatus.

Generally speaking, no matter what kind of modulation scheme is employed in a communication system, a digital to analog converter (DAC) is always utilized to convert a digital modulated signal into an analog signal for transmission. When designing a communication system, it is usually assumed that the used DAC is an ideal component. That is, the used DAC is regarded as an ideal DAC, which convert a digital signal into a corresponding analog signal without distortion.

However, due to environmental temperature variations or manufacturing process variations, most real world DAC cannot be assumed to be ideal components. A non-ideal effect a realistic DAC has is called a "DC offset effect", which makes the conversion curve of the DAC become erroneous. Please refer to FIG. 1, which illustrates the relationship between a digital input x and an analog output y of a DAC. Ideally, a DAC has a conversion curve of the solid line in FIG. 1, which passes through the origin of coordinates. However, the DC offset effect makes the conversion curve deviate from the origin of coordinates and become the dashed line in FIG. 2. In other words, even if the digital input x of the realistic DAC equals to zero, the analog output y of the realistic DAC is still a non-zero value. The non-zero value is called the DC offset value $y_D$ of the realistic DAC. The DC offset value $y_D$ deteriorates the signal transmission quality and downgrades the performance of the communication system employing the realistic DAC. For some kinds of communication systems demanding high signal transmission quality, the DC offset effect is a problem that must be solved.

To avoid the problems caused by the DC offset effect, two compensation schemes can be used, one of which compensates on the digital input of the DAC, the other compensates on the analog output of the DAC. Since the digital compensation scheme provides relatively stable and accurate results, it is always adopted to eliminate the DC offset effect.

Basically, DACs on different chips always have different DC offset values. Even for a single DAC, it is also possible that the DAC has different DC offset values at different times. Hence, the optimal solution is to calibrate the DAC in advance every time before the apparatus employing the DAC is going to be used. If the apparatus is a transceiver capable of transmitting and receiving, an analog to digital converter (ADC) set in the receiving path of the transceiver can be utilized as an auxiliary tool to measure the DC offset value of the DAC.

In actuality, not only the DACs have non-ideal DC offset effects, but the ADCs are also faced with non-ideal DC offset effects. Hence the realistic conversion equations of a realistic DAC and ADC are as shown by the following equation (1) and equation (2) respectively:

$$y = \rho_{YX'}(x - x_C) \quad (1);$$

$$z = \rho_{ZY'}y + z_D \quad (2);$$

where x represents the digital input of the DAC; y represents the analog output of the DAC or the analog input of the ADC; $\rho_{YX'}$ represents the slope of the DAC conversion curve; $x_C$ and $z_D$ represent the DC offset effects of the DAC and the ADC respectively.

It is quite a simple job to measure the DC offset value $z_D$ of an ADC. Connecting the input end of the ADC to ground, the outputted digital value would be the DC offset $z_D$ of the ADC. On the other hand, for measuring the $x_C$ value, the conventional method connects the output end of the DAC to the input end of the ADC, applies a digital value '0' to the DAC, and measures the digital output $z_E$ of the ADC. The following equation (3) is then obtained:

$$z_E = \rho_{ZY'}\rho_{YX'}(0 - x_C) + z_D = -\rho_{ZX'}x_C + z_D \quad (3);$$

where $\rho_{ZX'} = \rho_{ZY'}\rho_{YX'}$.

Since different chips have different $\rho_{ZX'}$ values, the conventional method measures the actual $\rho_{ZX'}$ values of a lot of sample chips to determine an average $\rho_{ZX'}$ value. The determined average $\rho_{ZX'}$ value is then set in many different systems as a predetermined calibration parameter. With the predetermined calibration parameter $\rho_{ZX'}$ and the given values $z_E$ and $z_D$, each unique system can determine the DC offset value $x_C$ of its DAC. Using the determined DC offset value $x_C$ to calibrate digital input signal of the DAC, the DC offset effect is eliminated. The equation for determining $x_C$ is as shown by the following equation (4):

$$x_C = (z_D - z_E)/\rho_{ZX'} \quad (4).$$

However, the above-mentioned conventional method has a few drawbacks. First of all, a lot of sample chips must be used be used to determine the average $\rho_{ZX'}$ value. Then, for each chip, it is still possible that an error exist between the actual $\rho_{ZX'}$ value and the average $\rho_{ZX'}$ value. If the error does exist, using the average $\rho_{ZX'}$ value, as a predetermined calibration parameter $\rho_{ZX'}$ might not be able to eliminate the DC offset effect of the DAC.

SUMMARY OF INVENTION

It is therefore an objective of the claimed invention to provide a DAC DC offset calibration method and related apparatus that determines a DC offset value of a DAC without using any predetermined calibration parameter.

According to the claimed invention, a DC offset calibration method for calibrating a DAC is disclosed. The method includes: applying a first value to the DAC to generate a first measurement value; applying a second value to the DAC to generate a second measurement value; determining a DC compensation value according to the first value, the second value, the first measurement value, and the second measurement value without using any predetermined calibration parameter; and calibrating the DAC with the DC compensation value.

According to the claimed invention, an apparatus for calibrating a DAC is disclosed. The apparatus includes: a computation module electrically connected to DAC, for determining a DC compensation value according to a first value, a second value, a first measurement value, and a second measurement value without using any predetermined calibration parameter; and a compensation module electrically connected to DAC and the computation module, for calibrating the DAC with the DC compensation value.

These and other objectives of the claimed invention will no doubt become obvious to those of ordinary skill in the art after reading the following detailed description of the preferred embodiment that is illustrated in the various figures and drawings.

DETAILED DESCRIPTION

In order to avoid the inaccurate calibration problem caused by using predetermined parameters, the present invention calibrates the DC offset effect of a DAC without using any predetermined parameter. More specifically, the present invention uses an interpolation method to determine the DC offset value of the DAC, and uses the accurately determined DC offset value to calibrate the DAC. Since no predetermined parameter is required, the present invention does not have to perform tests on a lot of sample chips to determine needed parameters (such as the above-mentioned calibration parameter $\rho_{ZX}$). Besides, no predetermined parameter is required to be pre-stored in each system; hence memory space is further saved.

Figure 1:
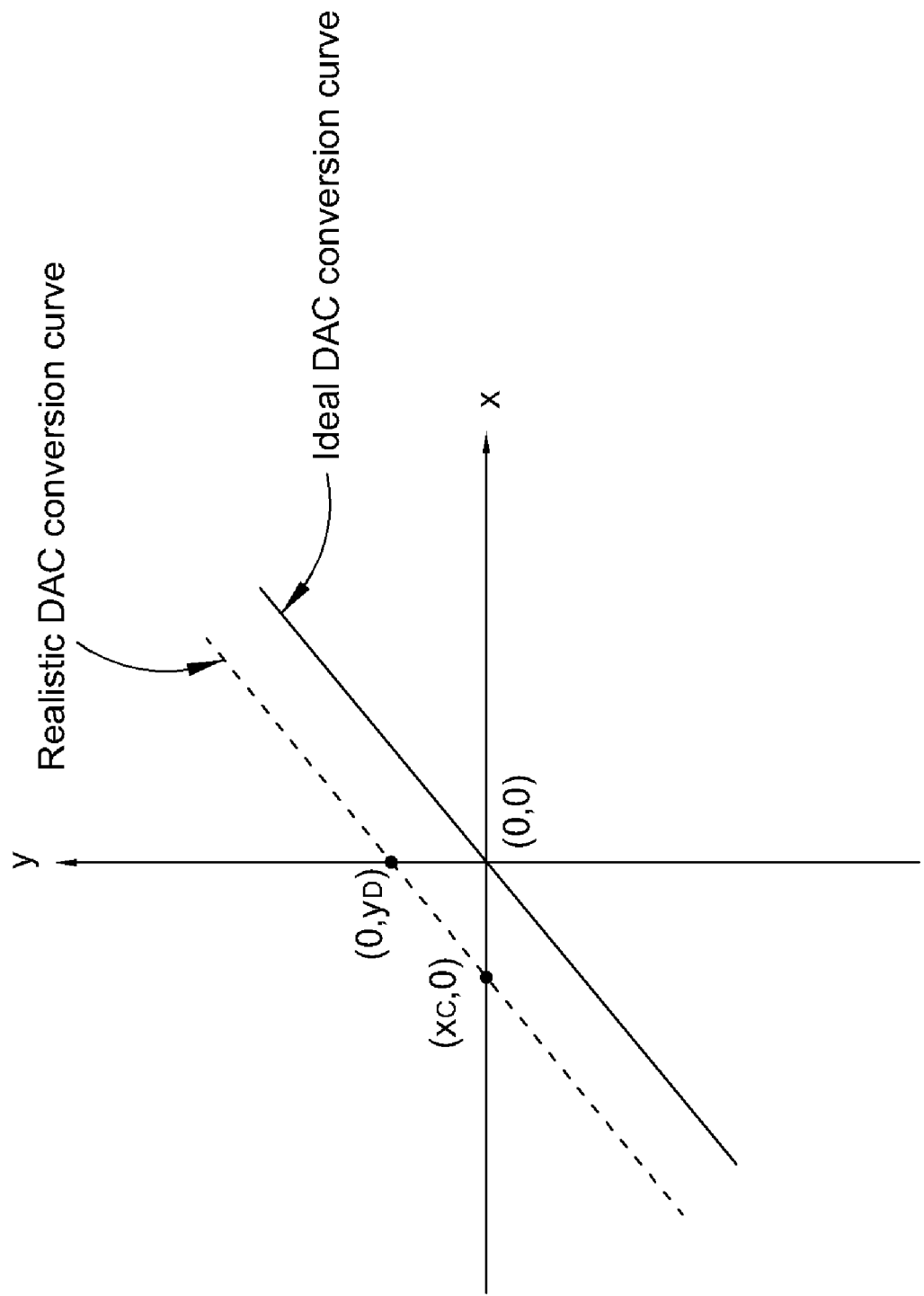
FIG. 1 shows a realistic conversion curve and an ideal conversion curve of a DAC.
Figure 2:
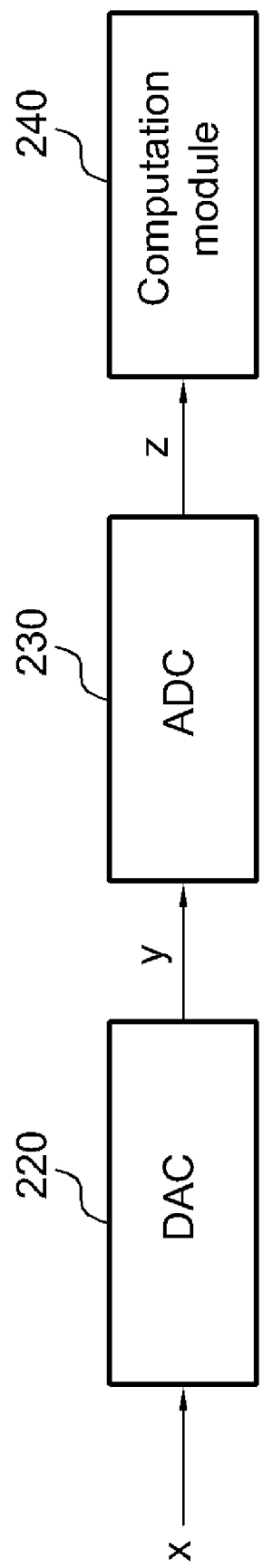
FIG. 2 shows a block diagram illustrating how components are interconnected when the method of the present invention is performed.

To calibrate for the DC offset effect of a DAC 220, the present invention connects the output end of the DAC 220 to the input end of an ADC 230, and connects the output end of the ADC 230 to a computation module 240. The interconnection relation between these three components is as shown in FIG. 2. In FIG. 2, the DAC 220 and ADC 230 can be, but are not limited to, a DAC in the transmission path of a transmitter and an ADC in the receiving path of a transmitter.

Figure 3:
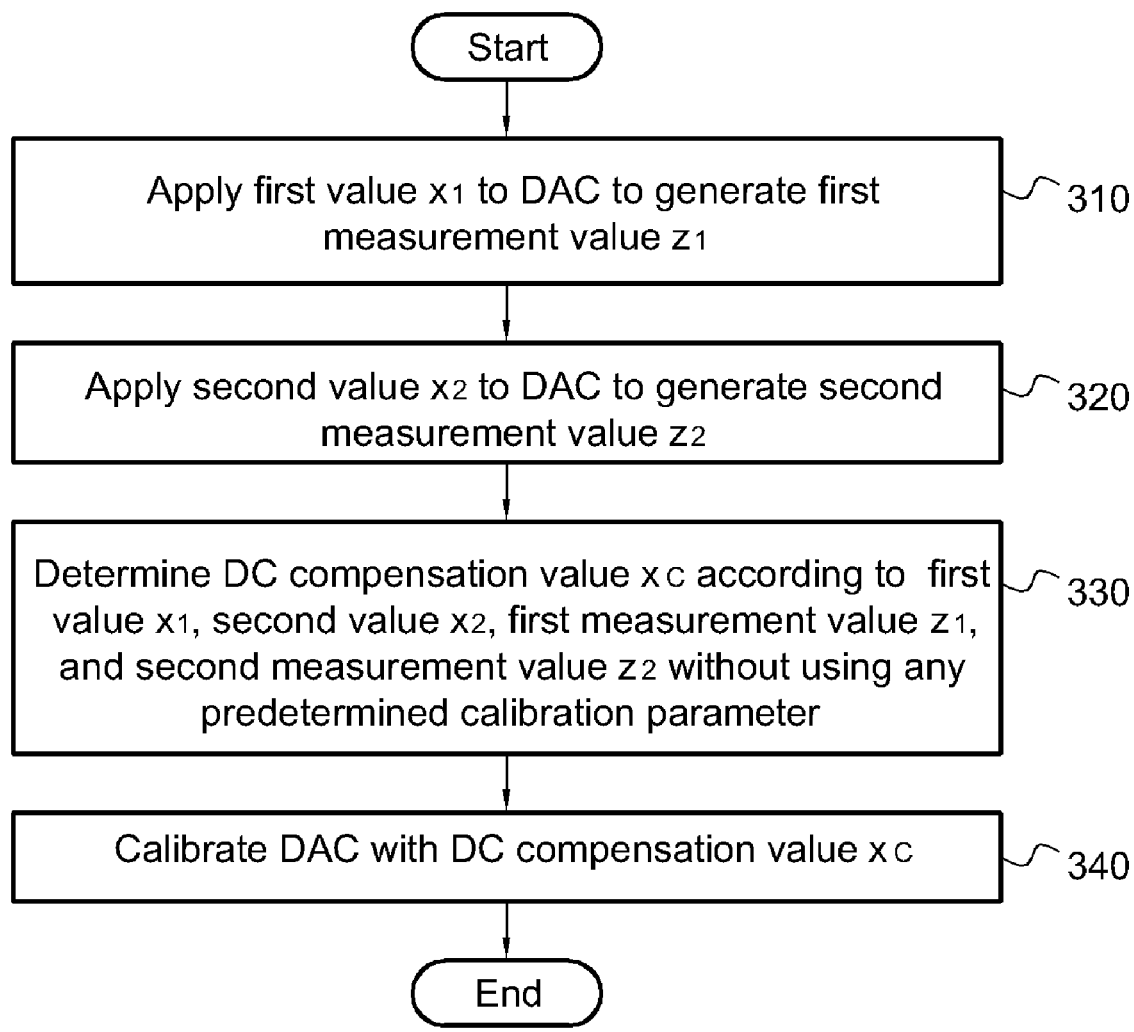
FIG. 3 shows a flowchart of a DAC DC offset calibration method according to the present invention.

FIG. 3 shows a flowchart of a DAC DC offset calibration method according to an embodiment of the present invention. The steps of FIG. 3 are as follows. First, in step 310, a first value $x_1$ is applied to the DAC 220 and the output of the ADC 230 is measured as a first measurement value $z_1$. Next, in step 320, a second value $x_2$ is applied to the DAC 220 and the output of the ADC 230 is measured as a second measurement value $z_2$. Through these two steps, the following equations (5) and (6) are obtained:

$$z_1 = \rho_{ZX'}(x_1 - x_C) + z_D \quad (5);$$

$$z_2 = \rho_{ZX'}(x_2 - x_C) + z_D \quad (6).$$

In equations (5) and (6), there are two values remaining unknown, which are $\rho_{ZX}$ and $x_C$ ($x_C$ being the DC offset value of the DAC 220). The two unknown values can be determined by the two equations. Hence in step 330, without using any predetermined calibration parameter, the computation module 240 can determine the DC compensation value $x_C$ according to the first value $x_1$, the second value $x_2$, the first measurement value $z_1$, and the second measurement value $z_2$ in a variety of ways. In step 330, a first way is that the computation module 240 determines the DC compensation value $x_C$ according to the following equation (7):

$$x_C = [(z_2 - z_D) \cdot x_1 - (z_1 - z_D) \cdot x_2]/(z_2 - z_1) \quad (7).$$

A second way of step 330 is that the computation module 240 determines the slope value $\rho_{ZX}$ first, then substitutes the determined slope value $\rho_{ZX}$ into equation (5), equation (6), or another equation composed of other input/output values, to determine the DC compensation value $x_C$. The equations used in the second solution are as follows:

$$\rho_{ZX} = (z_2 - z_1)/(x_2 - x_1) \quad (8);$$

$$x_C = x_1 - [(z_1 - z_D)/\rho_{ZX}] \quad (9).$$

Since no possibly inaccurate calibration parameter is used, the DC compensation value $x_C$ determined by the computation module 240 is a value correctly representing the DC offset effect of the DAC 220. Finally, in step 340, after each of the components are switched back to its original positions in the system, a compensation module (such as an adder) connected to the input end of the DAC 220 is used to calibrate the DAC 220 according to the determined DC compensation value $x_C$. More particularly, the DC compensation value $x_C$ is subtracted from each digital value before the digital value is applied to the DAC 220. The DC offset effect of the DAC 220 is then eliminated.

In contrast to the conventional method, the present invention has some advantages. One advantage is that no predetermined calibration parameter is used, hence the present invention requires no additional memory space to store predetermined calibration parameters. Another advantage is that for each unique chip, the DC offset value is accurately determined, and then digital compensation manner is performed, hence DC offset effect is correctly eliminated. Further more, even when environmental parameters cause characteristics of a single chip change, the present invention can still eliminate the DC offset effect of the single chip easily.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A DC offset calibration method for calibrating a DAC, the method comprising:
    applying a first value to the DAC to generate a first measurement value;
    applying a second value to the DAC to generate a second measurement value;
    determining a DC compensation value according to the first value, the second value, the first measurement value, and the second measurement value without using any predetermined calibration parameter; and
    calibrating the DAC with the DC compensation value.

2. The method of claim 1, wherein the step of calibrating the DAC comprises:
    utilizing the DC compensation value to adjust digital input values of the DAC before the digital input values are applied to the DAC.

3. The method of claim 1, wherein the first measurement value and the second measurement value correspond to analog output signals of the DAC when the first value and the second value are applied to the DAC respectively.

4. The method of claim 1, further comprising:
    connecting an output end of the DAC to an input end of an ADC;
    wherein the first measurement value and the second measurement value correspond to digital output values of the ADC when the first value and the second value are applied to the DAC respectively.

5. The method of claim 4, wherein the ADC has a DC offset value $z_D$, and the DC compensation value is determined according to the following equation:

$$x_C=[(z_2-z_D)\cdot x_1-(z_1-z_D)\cdot x_2]/(z_2-z_1);$$

where $x_C$ is the DC compensation value, $x_1$ is the first value, $x_2$ is the second value, $z_1$ is the first measurement value, and $z_2$ is the second measurement value.

6. The method of claim 4, wherein the step of determining the DC compensation value further comprises:
 determining a slope value according to the first value, the second value, the first measurement value, and the second measurement value; and
 determining the DC compensation value according to the slope value, the first value, and the first measurement value.

7. The method of claim 6, wherein the ADC has a DC offset value $z_D$, and the slope value and the DC compensation value are determined according to the following equations:

$$\rho_{ZX}=(z_2-z_1)/(x_2-x_1); \text{ and}$$

$$x_C=x_1-[(z_1-z_D)/\rho_{ZX}];$$

where $\rho_{ZX}$ is the slope value, $x_C$ is the DC compensation value, $x_1$ is the first value, $x_2$ is the second value, $z_1$ is the first measurement value, and $z_2$ is the second measurement value.

8. The method of claim 1, wherein the method is utilized by a transmitter or a transceiver.

9. An apparatus for calibrating a DAC, the apparatus comprising:
 a computation module electrically connected to DAC, for determining a DC compensation value according to a first value, a second value, a first measurement value, and a second measurement value without using any predetermined calibration parameter; and
 a compensation module electrically connected to DAC and the computation module, for calibrating the DAC with the DC compensation value.

10. The apparatus of claim 9, wherein the compensation module utilizes the DC compensation value to adjust digital values going to be applied to the DAC.

11. The apparatus of claim 9, wherein the first measurement value and the second measurement value correspond to analog output signals of the DAC when the first value and the second value are applied to the DAC respectively.

12. The apparatus of claim 9, further comprising:
 an ADC having an input end electrically connected to an output end of the DAC, and having an output end electrically connected to the computation module;
 wherein the first measurement value and the second measurement value correspond to digital output signals of the ADC when the first value and the second value are applied to the DAC respectively.

13. The apparatus of claim 12, wherein the ADC has a DC offset value $z_D$, and the computation module determines the DC compensation value according to the following equation:

$$x_C=[(z_2-z_D)\cdot x_1-(z_1-z_D)\cdot x_2]/(z_2-z_1);$$

where $x_C$ is the DC compensation value, $x_1$ is the first value, $x_2$ is the second value, $z_1$ is the first measurement value, and $z_2$ is the second measurement value.

14. The apparatus of claim 12, wherein the computation module determines a slope value according to the first value, the second value, the first measurement value, and the second measurement value; and the computation module further determines the DC compensation value according to the slope value, the first value, and the first measurement value.

15. The apparatus of claim 14, wherein the ADC has a DC offset value $z_D$, and the computation module determines the slope value and the DC compensation value according to the following equations:

$$\rho_{ZX}=(z_2-z_1)/(x_2-x_1); \text{ and}$$

$$x_C=x_1-[(z_1-z_D)/\rho_{ZX}];$$

where $\rho_{ZX}$ is the slope value, $x_C$ is the DC compensation value, $x_1$ is the first value, $x_2$ is the second value, $z_1$ is the first measurement value, and $z_2$ is the second measurement value.

16. The apparatus of claim 9, wherein the apparatus and the DAC are set in a transmitter or a transceiver.

* * * * *